(12) United States Patent
Yang et al.

(10) Patent No.: US 11,522,091 B2
(45) Date of Patent: Dec. 6, 2022

(54) SOLAR CELL

(71) Applicant: Shangrao Jinko solar Technology Development Co., LTD, Hangxi (CN)

(72) Inventors: Juhong Yang, Seoul (KR); Indo Chung, Seoul (KR); Eunjoo Lee, Seoul (KR); Mihee Heo, Seoul (KR)

(73) Assignee: Shangrao Jinko solar Technology Development Co., LTD

( * ) Notice: Subject to any disclaimer, the term of this patent is extended or adjusted under 35 U.S.C. 154(b) by 0 days.

(21) Appl. No.: 15/416,486

(22) Filed: Jan. 26, 2017

(65) Prior Publication Data
US 2017/0213921 A1    Jul. 27, 2017

(30) Foreign Application Priority Data

Jan. 27, 2016 (KR) .................. 10-2016-0010054
Jan. 23, 2017 (KR) .................. 10-2017-0010138

(51) Int. Cl.
| H01L 31/00 | (2006.01) |
| H01L 31/0216 | (2014.01) |
| H01L 31/068 | (2012.01) |
| H01L 31/0224 | (2006.01) |
| H01L 31/0236 | (2006.01) |

(52) U.S. Cl.
CPC .. *H01L 31/02168* (2013.01); *H01L 31/02167* (2013.01); *H01L 31/02363* (2013.01); *H01L 31/022441* (2013.01); *H01L 31/0682* (2013.01); *Y02E 10/547* (2013.01)

(58) Field of Classification Search
CPC ......... H01L 31/02168; H01L 31/02167; H01L 31/022441; H01L 31/02363; H01L 31/0682; Y02E 10/547

USPC ................................................. 136/243–293
See application file for complete search history.

(56) References Cited

U.S. PATENT DOCUMENTS

| 2005/0009373 | A1* | 1/2005 | Bao ...................... H01L 21/0276 438/787 |
| 2007/0256728 | A1* | 11/2007 | Cousins .............. H01L 31/0745 136/252 |
| 2008/0203908 | A1* | 8/2008 | Hasegawa ........... H01L 51/5253 313/504 |
| 2009/0151784 | A1* | 6/2009 | Luan ................. H01L 31/02366 438/69 |
| 2010/0051096 | A1 | 3/2010 | Kim et al. |

(Continued)

FOREIGN PATENT DOCUMENTS

| EP | 2922098 A1 | 9/2015 |
| EP | 3098860 A1 | 11/2016 |

(Continued)

*Primary Examiner* — Thanh Truc Trinh
(74) *Attorney, Agent, or Firm* — Tucker Ellis LLP

(57) ABSTRACT

Disclosed is a solar cell. The solar cell includes a semiconductor substrate, conductivity-type regions located in or on the semiconductor substrate, electrodes conductively connected to the conductivity-type regions, and insulating films located on at least one of opposite surfaces of the semiconductor substrate, and including a first film and a second film located on the first film, the second film has a higher carbon content than that of the first film, a refractive index of the second film is equal to or less than a refractive index of the first film, and an extinction coefficient of the second film is equal to or greater than an extinction coefficient of the first film.

7 Claims, 7 Drawing Sheets

(56) References Cited

U.S. PATENT DOCUMENTS

| | | |
|---|---|---|
| 2010/0186811 A1 | 7/2010 | Kim et al. |
| 2011/0146787 A1* | 6/2011 | Allen ................ H01L 31/02168 |
| | | 428/215 |
| 2012/0222741 A1 | 9/2012 | Davies et al. |
| 2014/0174532 A1 | 6/2014 | Stewart et al. |

FOREIGN PATENT DOCUMENTS

| | | |
|---|---|---|
| JP | 2009-204577 A | 9/2009 |
| JP | 2012-84608 A | 4/2012 |
| JP | 2015-177192 A | 10/2015 |
| KR | 10-2012-0021793 A | 3/2012 |
| KR | 10-2014-0143277 A | 12/2014 |
| KR | 10-2015-0108239 A | 9/2015 |

* cited by examiner

SOLAR CELL

CROSS-REFERENCE TO RELATED APPLICATIONS

This application claims the priority benefit of Korean Patent Application Nos. 10-2016-0010054, filed on Jan. 27, 2016 and 10-2017-0010138, filed on Jan. 23, 2017, in the Korean Intellectual Property Office, the disclosures of which are incorporated herein by reference.

BACKGROUND OF THE INVENTION

1. Field of the Invention

Embodiments of the present invention relate to a solar cell and, more particularly, to a solar cell having an improved structure.

2. Description of the Related Art

Recently, as exhaustion of conventional energy sources, such as oil and coal, is expected, interest in alternative energy as a substitute for such conventional energy sources has increased. Thereamong, solar cells are spotlighted as a next generation battery which converts solar energy into electric energy.

Such solar cells may be manufactured by forming various layers and electrodes according to a design. Solar cell efficiency may be determined according to the design of these various layers and electrodes. In order to commercialize solar cells, low efficiency should be overcome and, thus, the design of various layers and electrodes to maximize solar cell efficiency is required.

SUMMARY OF THE INVENTION

An object of the embodiments of the present invention is to provide a solar cell having an improved structure.

The objects of the embodiments of the present invention are not limited to the above-mentioned objects and other objects that have not been mentioned above will become evident to those skilled in the art from the following description.

To achieve the above objects, there is provided a solar cell according to an example embodiment of the present invention, including a semiconductor substrate, conductivity-type regions located in or on the semiconductor substrate, electrodes conductively connected to the conductivity-type regions, and insulating films located on at least one of opposite surfaces of the semiconductor substrate and including a first film and a second film located on the first film, wherein the second film has a higher carbon content than that of the first film, a refractive index of the second film is equal to or less than a refractive index of the first film, and an extinction coefficient of the second film is equal to or greater than an extinction coefficient of the first film.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
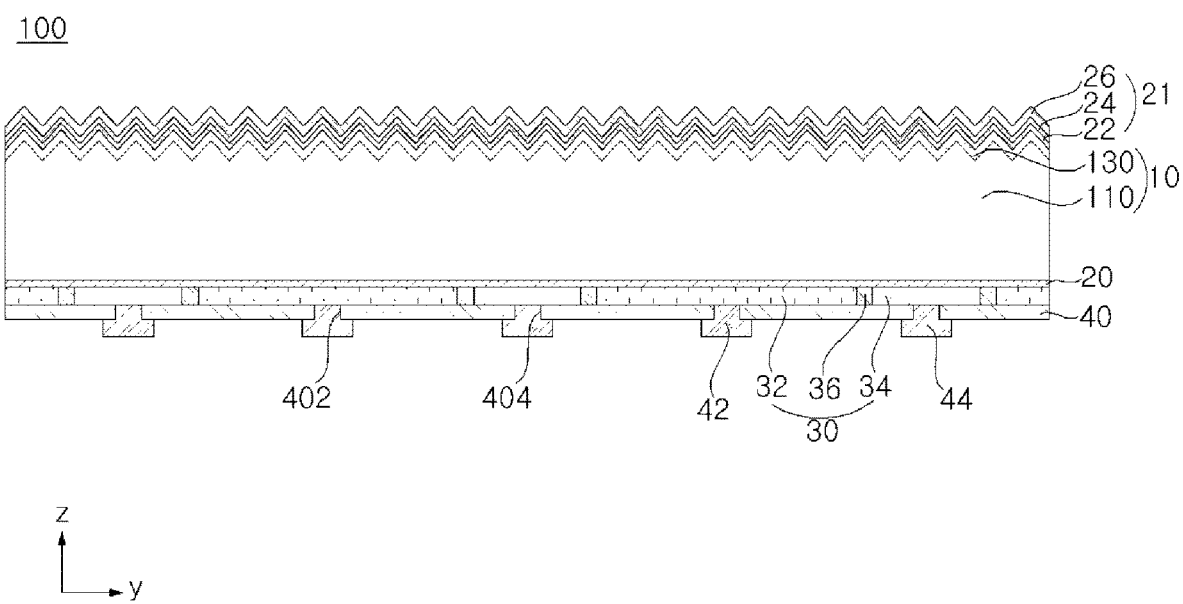
FIG. 1 is a cross-sectional view of a solar cell in accordance with one embodiment of the present invention.

Hereinafter, embodiments of the present invention will be described in detail with reference to the accompanying drawings. While the invention will be described in conjunction with example embodiments, it will be understood that the present description is not intended to only limit the invention to the example embodiments.

In the drawings, in order to clearly and briefly describe the invention, parts which are not related to the description will be omitted, and the same reference numbers will be used throughout the drawings to refer to the same or like parts. Further, in order to more clearly describe the invention, thicknesses, areas, etc. of elements are enlarged or reduced and thus the thicknesses, areas, etc. of the elements are not limited to the drawings.

In the following description of the embodiments, the term "including" will be interpreted as indicating the presence of other elements, unless stated otherwise, and does not exclude presence of the corresponding elements. In addition, it will be understood that when an element, such as a layer, a film, a region or a plate, is referred to as being "on" another element, it can be directly on the element, and one or more intervening elements may also be present therebetween. It will be understood that when an element, such as a layer, a film, a region or a plate, is referred to as being "directly on" another element, no intervening elements may be present therebetween.

Figure 2:
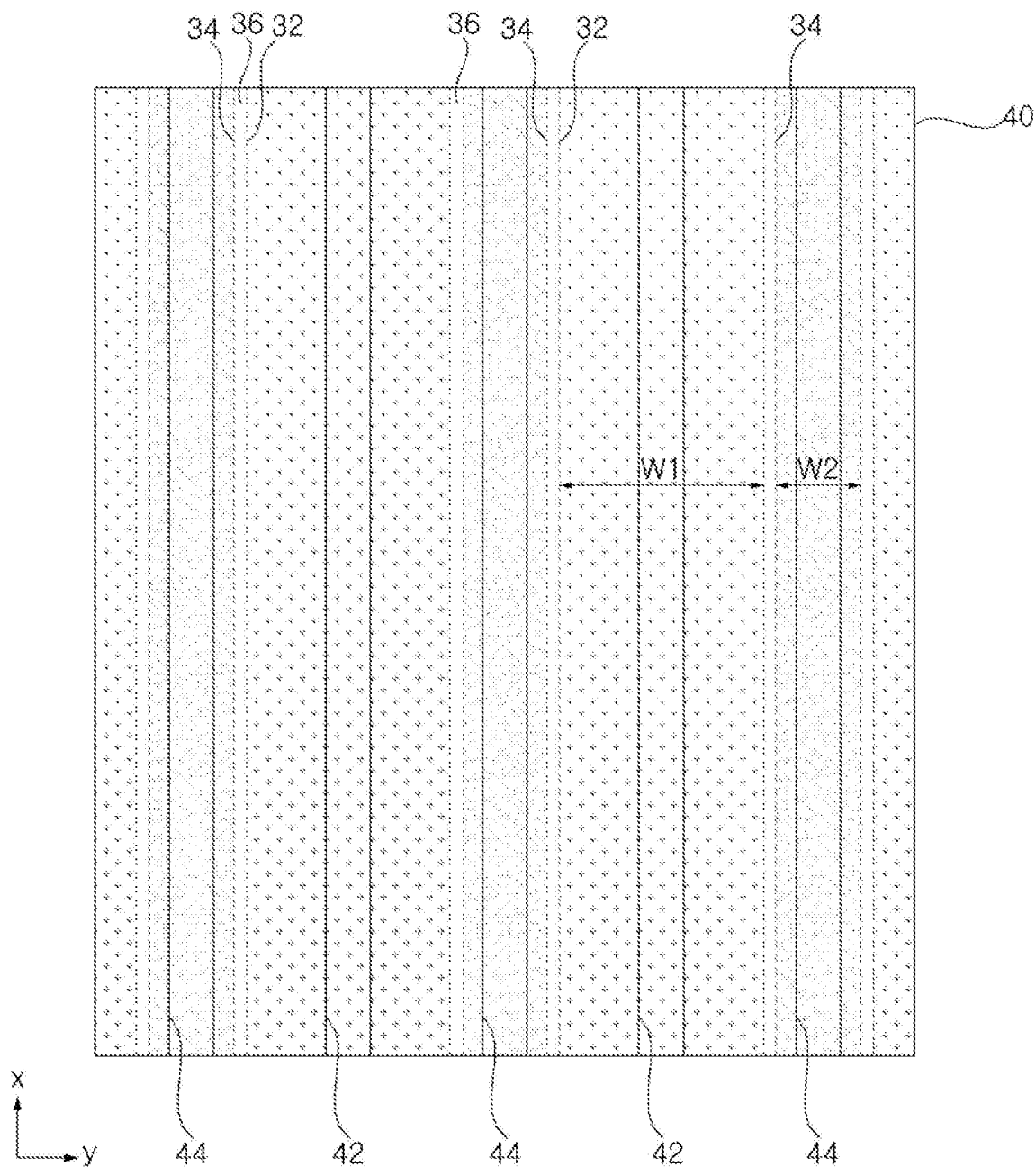
FIG. 2 is a partial plan view of the rear surface of the solar cell shown in FIG. 1.

FIG. 1 is a cross-sectional view of a solar cell in accordance with one embodiment of the present invention, and FIG. 2 is a partial plan view of the rear surface of the solar cell shown in FIG. 1.

With reference to FIGS. 1 and 2, a solar cell 100 in accordance with this embodiment includes a semiconductor substrate 10, conductivity-type regions 32 and 34 located in or on the semiconductor substrate 10, electrodes 42 and 44 conductively connected to the conductivity-type regions 32 and 34, and insulting films 21 located on at least one of both surfaces of the semiconductor substrate 10. In this instance, the conductivity-type regions 32 and 34 include regions of a first conductivity type, i.e., first conductivity-type regions 32, and regions of a second conductivity type, i.e., second conductivity-type regions 34. The electrodes 42 and 44 include first electrodes 42 conductively connected to the first conductivity-type regions 32 and second electrodes 44 conductively connected to the second conductivity-type regions 34. The insulating films 21 include a first film 24 and a second film 26 located on the first film 24, and may further include a third film 22 located between the first film 24 and the semiconductor substrate 10. The solar cell 100 in accordance with this embodiment may further include a control passivation layer 20, a rear passivation film 40, etc. Hereinafter, these elements will be described in more detail.

The semiconductor substrate 100 may include a base region 110 including a first or second conductivity-type dopant at a relatively low concentration and thus being of the first or second conductivity type. The base region 110 may be formed of a crystalline semiconductor including the first or second conductivity-type dopant. For example, the base region 110 may be formed of a monocrystalline or polycrystalline semiconductor including the first or second conductivity-type dopant (for example, monocrystalline or polycrystalline silicon). Particularly, the base region 110 may be formed of a monocrystalline semiconductor including the first or second conductivity-type dopant (for example, a monocrystalline semiconductor wafer and, in more detail, a semiconductor silicon wafer). If the solar cell 100 is manufactured based on the base region 110 or the semiconductor substrate 10 having high crystallinity and thus having few defects, electrical characteristics of the solar cell 100 are excellent or improved.

The base region 110 may be a p-type or an n-type. For example, if the base region 110 is the n-type, the area of the first conductivity-type regions 32 of the p-type, which forms a junction forming carriers by photoelectric conversion with the base region 110 (for example, a p-n junction with the control passivation layer 20 interposed therebetween), is increased and thus a photoelectric conversion area may be increased.

Further, in this instance, the first conductivity-type regions 32 having a large area may effectively collect holes having a relatively low moving speed and thus further contribute to improvement in photoelectric conversion efficiency. However, the disclosure is not limited thereto.

Further, the semiconductor substrate 10 may include a front surface electrical field region (or an electric field region) 130 located on the front surface of the semiconductor substrate 10. The front surface electric field region 130 may be the same conductivity-type as the base region 110 and have a higher doping concentration than the base region 110.

This embodiment by example illustrates the front surface electric field region 130 as a doping region formed by doping the semiconductor substrate 10 with the same dopant as the base region 110 at a relatively high concentration. Therefore, the front surface electric field region 130 including a crystalline (monocrystalline or polycrystalline) semiconductor being the second conductivity type forms a part of the semiconductor substrate 10.

However, the disclosure is not limited thereto. Therefore, the front surface electric field region 130 may be formed by doping a separate semiconductor layer (for example, an amorphous semiconductor layer, a microcrystalline semiconductor layer or a polycrystalline semiconductor layer) differing from the semiconductor substrate 10 with the second conductivity-type dopant. Otherwise, the front surface electric field region 130 may be an electric field region having a similar function as a region formed by doping a layer formed adjacent to the semiconductor substrate 10 (for example, a front passivation film 24 and/or an anti-reflection film 26) with fixed charges. For example, if the base region 110 is the n-type, the front passivation film 24 may be formed of an oxide having fixed negative charges (for example, aluminum oxide) and thus an inversion layer may be formed on the surface of the base region 110 and serve as an electric field region. In this instance, the semiconductor substrate 10 includes the base region 110 alone without separate doping regions and thus defects of the semiconductor substrate 10 may be minimized. In addition, front surface electric field regions 130 having various structures may be formed through various methods.

In this embodiment, the front surface of the semiconductor substrate 10 may have uneven parts, such as pyramids, by texturing. Texturing structures formed on the semiconductor substrate 10 may have a regular shape (for example, a pyramid shape) having the outer surface formed along a specific crystalline surface of the semiconductor. If surface roughness of the semiconductor substrate 10 is increased by the uneven parts formed on the front surface of the semiconductor substrate 10 by texturing, reflectivity of light incident upon the front surface of the semiconductor substrate 10 may be lowered. Therefore, the amount of light reaching the p-n junction formed by the base region 110 and the first conductivity-type regions 32 may be increased and thus light loss may be minimized.

The rear surface of the semiconductor substrate 10 may be a relatively smooth and flat surface having lower surface roughness than the front surface of the semiconductor substrate 10 by mirror-like finishing. If the first and second conductivity-type regions 32 and 34 are formed on the rear surface of the semiconductor substrate 10 as in this embodiment, characteristics of the solar cell 100 may greatly vary according to characteristics of the rear surface of the semiconductor substrate 10. Therefore, no uneven parts by texturing are formed on the rear surface of the semiconductor substrate 10 and, thus, passivation characteristics may be improved and characteristics of the solar cell 100 may be improved. However, the disclosure is not limited thereto, and, as circumstances require, uneven parts may be formed on the rear surface of the semiconductor substrate 10 by texturing. In addition, various modifications are possible.

The control passivation layer 20 may be formed on the rear surface of the semiconductor substrate 10. For example, the control passivation layer 20 contacts the rear surface of the semiconductor substrate 10 and may thus simplify the structure of the semiconductor substrate 10 and improve tunneling effects. However, the disclosure is not limited thereto.

The control passivation layer 20 acts as a kind of barrier to electrons and holes and, thus, does not pass minority carriers but may pass only majority carriers accumulated at regions adjacent to the control passivation layer 20 and then having energy of a designated intensity or more. In this instance, the majority carriers having energy of the designated intensity or more may easily pass through the control passivation layer 20 by tunneling effects. Further, the control passivation layer 20 may serve as a diffusion barrier, which prevents the dopants of the conductivity-type regions 32 and 34 from diffusing to the semiconductor substrate 10. The control passivation layer 20 may include various substances which may execute tunneling of majority carriers, for example, an oxide, a nitride, a semiconductor, a conductive polymer, etc. For example, the control passivation layer 20 may include silicon oxide, silicon nitride, silicon oxynitride, intrinsic amorphous silicon, intrinsic polycrystalline silicon, etc. Particularly, the control passivation layer 20 may be a silicon oxide layer including silicon oxide. The reason for this is that the silicon oxide layer has excellent passivation characteristics and easily executes tunneling of carriers.

In this instance, the control passivation layer 20 may be formed on the entirety of the rear surface of the semiconductor substrate 10. Therefore, the control passivation layer 20 may be easily formed without separate patterning.

In order to sufficiently achieve the tunneling effects, the control passivation layer 20 may have a small thickness. For example, the thickness T of the control passivation layer 120 may be 5 nm or less (in more detail, 2 nm or less and, for example, 0.5 nm to 2 nm).

If the thickness T of the control passivation layer 20 exceeds 5 nm, tunneling is not effectively executed and thus the solar cell 100 may not be operated and, if the thickness T of the control passivation layer 20 is less than 0.5 nm, it may be difficult to form the control passivation layer 20 having designated quality. In order to further improve the tunneling effects, the thickness T of the control passivation layer 20 may be 2 nm or less (in more detail, 0.5 nm to 2 nm). In this instance, in order to further improve the tunneling effects, the thickness T of the control passivation layer 20 may be 0.5 nm to 1.5 nm). However, the disclosure is not limited thereto and the thickness T of the control passivation layer 20 may have various values.

For example, the control passivation layer 20 may have a thickness which is equal to or less than the thickness of the rear passivation film 40 and the thicknesses of the insulating films 20 (in more detail, the respective thicknesses of the first film 24, the second film 26 and the third film 22 of the insulating films 20). Particularly, the control passivation layer 20 may have a less thickness than the thickness of the rear passivation film 40 and the thicknesses of the insulating films 20 (in more detail, the respective thicknesses of the first film 24, the second film 26 and the third film 22 of the insulating films 20). The reason for this is that, in order to execute the tunneling effects, it is advantageous in that the control passivation layer 20 has a minimal thickness that is effective.

A semiconductor layer 30 including the conductivity-type regions 32 and 34 may be located on the control passivation layer 20. For example, the semiconductor layer 30 contacts the control passivation layer 20 and may thus simplify the structure of the semiconductor substrate 10 and improve tunneling effects. However, the disclosure is not limited thereto.

In this embodiment, the semiconductor layer 30 may include the first conductivity-type regions 32 including the first conductivity-type dopant and thus exhibiting the first conductivity type, and the second conductivity-type regions 34 including the second conductivity-type dopant and thus exhibiting the second conductivity type. The first conductivity-type regions 32 and the second conductivity-type regions 34 may be located on the control passivation layer 20 so as to be coplanar with each other. That is, no intervening layer may be located between the first and second conductivity-type regions 32 and 34 and the control passivation layer 20 or, if another layer is located between the first and second conductivity-type regions 32 and 34 and the control passivation layer 20, such a layer may have the same stack structure. Further, a barrier region 36 which is coplanar with the first and second conductivity-type regions 32 and 34 may be located between the first conductivity-type region 32 and the second conductivity-type region 34.

For example, in this embodiment, the first conductivity-type regions 32 form emitter regions, which form a p-n junction (or a p-n tunnel junction) with the base region 110 with the control passivation layer 20 interposed therebetween and thus generate carriers by photoelectric conversion. The second conductivity-type regions 34 form back surface electric field regions, which form a back surface electric field and thus prevent carrier loss due to recombination on the surface of the semiconductor substrate 10 (in more detail, on the rear surface of the semiconductor substrate 10).

In this instance, the first conductivity-type regions 32 may include a semiconductor (for example, silicon) including the first conductivity-type dopant which is opposite to the conductivity type of the base region 110. The second conductivity-type regions 34 may include the second conductivity-type dopant which is the same as the conductivity type of the base region 110, and the concentration of the second conductivity-type dopant in the second conductivity-type regions 34 may be greater than that of the base region 110. In this embodiment, the first and second conductivity-type regions 32 and 34 are formed on the semiconductor substrate 10 (in more detail, on the control passivation layer 20) separately from the semiconductor substrate 10, and are formed of semiconductor layers doped with the first and second conductivity-type dopants. Therefore, in order to easily form the first and second conductivity-type regions 32 and 34 on the semiconductor substrate 10, the first and second conductivity-type regions 32 and 34 may be formed of semiconductor layers having different crystalline structures from the semiconductor substrate 10. For example, the first and second conductivity-type regions 32 and 34 may be formed by doping an amorphous semiconductor, a microcrystalline semiconductor or a polycrystalline semiconductor (for example, amorphous silicon, microcrystalline silicon or polycrystalline silicon), which is easily manufactured through various methods, such as deposition, with the first or second conductivity-type dopant. Particularly, if the first and second conductivity-regions 32 and 34 include a polycrystalline semiconductor, the first and second conductivity-regions 32 and 34 may have high carrier mobility. The first or the second conductivity-type dopant may be included in the semiconductor layer 30 during a process of forming the semiconductor layer 30, or be included in the semiconductor layer 30 through various doping methods, such as thermal diffusion, ion implantation, etc., after formation of the semiconductor layer 30.

In this instance, various substances, which dope the semiconductor layer 30 and thus exhibit the n-type or the p-type, may be used as the first or second conductivity-type dopant. If the first or second conductivity-type dopant is a p-type dopant, group-III elements, such as boron (B), aluminum (Al), gallium (Ga), indium (In), etc., may be used. If the first or second conductivity-type dopant is an n-type dopant, group-VI elements, such as phosphorous (P), arsenic (As), bismuth (Bi), antimony (Sb), etc., may be used. For example, boron (B) may be one of the first and second conductivity-type dopants, and phosphorous (P) may be the other.

However, the disclosure is not limited thereto, and the first conductivity-type regions 32 may form back surface electric field regions and the second conductivity-type regions 34 may form emitter regions.

Further, the barrier region 36 is located between the first conductivity-type region 32 and the second conductivity-type region 34 and thus separates the first conductivity-type region 32 and the second conductivity-type region 34 from each other. If the first conductivity-type region 32 and the second conductivity-type region 34 contact each other, shunt occurs and may thus lower performance of the solar cell 100. Therefore, in this embodiment, unnecessary shunt may be prevented by locating the barrier region 36 between the first conductivity-type region 32 and the second conductivity-type region 34.

The barrier region 36 may use an undoped insulating material (for example, an oxide or a nitride). Otherwise, the barrier region 36 may include an intrinsic semiconductor. In this instance, the barrier region 36 and the first and second conductivity-type regions 32 and 34 may be formed of the same semiconductor (for example, amorphous silicon, microcrystalline silicon or polycrystalline silicon) so that the side surfaces of the barrier region 36 contact the side surfaces of the first conductivity-region 32 and the second conductivity-type region 34 and, in this instance, the barrier region 36 may be formed of an i-type (intrinsic) semiconductor material which substantially includes no dopant. For example, when a semiconductor layer including a semiconductor material is formed, the first conductivity-type regions 32 are formed by doping some regions of the semiconductor layer with the first conductivity-type dopant and the second conductivity-type regions 34 are formed by doping some of other regions of the semiconductor layer with the second conductivity-type dopant, the remaining regions may be used as the barrier regions 36. Thereby, a method of manufacturing the first conductivity-type regions 32, the second conductivity-type regions 34 and the barrier regions 36 may be simplified.

However, the disclosure is not limited thereto. Therefore, the barrier regions 36 may be formed through various methods and have various thicknesses and various shapes. The barrier regions 36 may be formed as vacant spaces, i.e., trenches. In addition, the barrier regions 36 may be variously modified. The figures by example illustrate the barrier region 36 as separating the entirety of the first conductivity-type region 32 and the entirety of the second conductivity-type region 34 from each other. However, the barrier region 36 may separate a part of the first conductivity-type region 32 and a part of the second conductivity-type region 34 from each other at the boundary therebetween. Alternatively, no barrier region 36 may be formed and thus the first conductivity-type region 32 and the second conductivity-type region 34 may contact each other at the boundary therebetween.

The rear passivation film 40 may be formed on the first and second conductivity-type regions 32 and 34 and the barrier regions 36 on the rear surface of the semiconductor substrate 10. For example, the rear passivation film 40 may contact the first and second conductivity-type regions 32 and 34 and the barrier regions 36, thus simplifying the structure of the solar cell 100. However, the disclosure is not limited thereto.

Further, the insulating films 21 including the first film 24 and the second film 26, sequentially formed, may be located on the front surface of the semiconductor substrate 10 (in more detail, on the front surface electric field region 130 formed on the front surface of the semiconductor substrate 10). In this instance, the second film 26 has a carbon content which is greater than that of the first film 24, a refractive index which is equal to or less than that of the first film 24, and an extinction coefficient which is equal to or greater than that of the first film 24. Particularly, the refractive index of the second film 26 may be less than the refractive index of the first film 24, and the extinction coefficient of the second film 26 may be greater than the extinction coefficient of the first film 24. Further, the third film 22, which is formed of a material different from that of the first film 24 and the second film 26 or has a composition different from that of the first film 24 and the second film 26, may be formed between the semiconductor substrate 10 (or the front surface electric field region 130) and the first film 24.

In this instance, the first film 24 may be a silicon nitride film including silicon nitride, and the second film 26 may be a silicon carbonitride film including silicon nitride including carbon (i.e., silicon carbonitride), a silicon oxycarbide film including silicon nitride including carbon (i.e., silicon oxycarbide) or a film including a mixture thereof. Or the first film 24 may be a silicon carbide film including silicon carbide, and the second film 26 may be the silicon carbonitride film including silicon carbonitride. Further, the third film 22 may be a silicon oxide film including silicon oxide and, in more detail, may be a thermal oxide film formed by thermal oxidation.

The first film 24 is stacked together with the third film 22 and may thus greatly improve passivation characteristics of the semiconductor substrate 10. The reason for this is that, when a silicon oxide film and a silicon nitride film are stacked, passivation characteristics of the semiconductor substrate 10 including silicon may be most effectively improved. In this instance, the first film 24 and the third film 22 may include no carbon or have a lower carbon content (for example, lower % by weight of carbon) than that of the second film 25. Particularly, the first film 24 and the third film 22 may include no carbon. Since carbon may somewhat lower passivation characteristics, the first film 24 and the third film 22 serving as passivation films may include no carbon.

The second film 26 may include carbon and have excellent chemical stability (for example, stability against an acid or a base). Particularly, in this embodiment, for the purpose of excellent passivation characteristics, the first film 24 has relatively low refractive index and extinction coefficient and, in this instance, the first film 24 may have somewhat low chemical stability. Therefore, in this embodiment, among the insulating films 21, the second film 26, which is most distant from the semiconductor substrate 10 and forms the outermost surface, includes carbon so as to maintain excellent chemical stability. Therefore, the second film 26 may act as a capping film during an etching process in manufacture of the solar cell 100. Therefore, a process of forming and removing a separate capping film may be omitted. If the second film 26 is a silicon carbonitride film or a silicon oxycarbide film which includes nitrogen or oxygen in addition to carbon, as described above, reactivity with oxygen may be lowered and thus oxidation may be effectively prevented. On the other hand, if the second film 26 is a silicon carbide film including carbon without nitrogen or oxygen, the second film 26 may be easily oxidized at a temperature of 300° C. or higher and, thus, the refractive index and the extinction coefficient of the second film 26 may be changed and the second film 26 cannot maintain desired characteristics.

Further, in this embodiment, the second film 26 includes carbon and, thus, the refractive index and the extinction coefficient of the second film 26 may be easily adjusted. Therefore, the second film 26 may have desired refractive index and extinction coefficient.

Therefore, the refractive index of the second film 26 may be equal to or less than the refractive index of the first film 24. For example, with respect to light having a wavelength of 633 nm, the refractive index of the second film 26 may be equal to or less than the refractive index of the first film 24. In this instance, light having a wavelength of 633 nm is purely by example and the disclosure is not limited thereto. In more detail, the refractive index of the second film 26 may be less than the refractive index of the first film 24. In this instance, the second film 26 located at a more exterior position than that of the first film 24 has a relatively low refractive index and thus lowers reflectivity. Further, the extinction coefficient of the second film 26 may be equal to or greater than the extinction coefficient of the first film 24. Thereby, change of characteristics of the solar cell 100 by light or damage to the solar cell 100 due to light may be prevented. Particularly, light having a short wavelength (for example, light having a wavelength of 400 nm or shorter or ultraviolet light) may easily change characteristics of the solar cell 100 and easily damage the solar cell 100. In more detail, the extinction coefficient of the second film 26 with respect to light having a short wavelength may be equal to or greater than the extinction coefficient of the first film 24 with respect to light having the short wavelength. By maintaining the extinction coefficient of the second film 26 at the same level of the extinction coefficient of the first film 24 at the least, the first film 24 and the second film 26 absorb light having a short wavelength and, thus, stability against light having the short wavelength may be improved.

Particularly, if the extinction coefficient of the second film 26 with respect to light having a short wavelength is greater than the extinction coefficient of the first film 24 with respect to light having the short wavelength, the second film 26 located at the exterior position absorbs a larger amount of light having the short wavelength and, thus, stability against light having the short wavelength may be greatly improved. The first film 24 has a relatively low extinction coefficient and, thus, the first film 24 together with the third film 22 may maintain excellent passivation effects. For reference, if the first film 24 has a high refractive index and a high extinction coefficient, passivation characteristics may be lowered.

As such, if the second film 26 has a lower refractive index than that of the first film 24 and a greater extinction coefficient than that of the first film 24, reflectivity lowering effects due to a difference in refractive indexes may be maximized, excellent passivation effects may be maintained by the relatively low extinction coefficient of the first film 24, and stability against light having a short wavelength may be greatly improved by the relatively high extinction coefficient of the second film 26.

For example, extinction coefficients of the first film 24 and the second film 26 with respect to light having a wavelength of 400 nm or shorter (for example, 400 nm) may be respectively 0.25 or less. If the first film 24 has a relatively small extinction coefficient, excellent passivation characteristics due to a field effect may be maintained. On the other hand, if the first film 24 has a relatively great extinction coefficient (i.e., an extinction coefficient exceeding 0.25 with respect to light having a wavelength of 400 nm or shorter (for example, 400 nm)), passivation characteristics may be lowered. Further, if extinction coefficients of the first film 24 and the second film 26 are great, the first film 24 and the second film 26 absorb an excessively great amount of light used in the solar cell 100 and thus light loss may be excessively high. However, as described above, if extinction coefficients are small, chemical stability may be somewhat lowered. In this embodiment, such problem may be solved by locating the second film 26, including carbon and having excellent chemical stability, on the first film 24. For example, the extinction coefficient of the first film 24 with respect to light having a wavelength of 400 nm or shorter (for example, 400 nm) may be 0.20 or less. If the extinction coefficient of the first film 24 with respect to light having a wavelength of 400 nm or shorter (for example, 400 nm) is 0.20 or less, passivation characteristics may be further improved.

In this instance, if the second film 26 has a greater extinction coefficient with respect to light having a short wavelength than that of the first film 24, as described, light having the short wavelength may be effectively absorbed. The extinction coefficient of the second film 26 with respect to light having a wavelength of 400 nm or shorter (for example, 400 nm) may be greater than the extinction coefficient of the first film 24 with respect to light of such a wavelength by 0.01 or more. If the above-described difference is less than 0.01, short wavelength light absorption of the second film 26 may not be great. For example, the extinction coefficient of the second film 26 with respect to light having a wavelength of 400 nm or shorter (for example, 400 nm) may be greater than the extinction coefficient of the first film 24 with respect to light of such a wavelength by 0.01 to 0.10 (for example, 0.01 to 0.06). The reason for this is that, by addition of carbon alone, it may be difficult to greatly increase the extinction coefficient of the second film 26 so that an extinction coefficient difference between the first film 24 and the second film 26 exceeds 0.10 (for example, 0.06). Further, if the extinction coefficient of the second film 26 is excessively great, an excessively great amount of light used in the solar cell 100 is absorbed and thus light loss may be excessively high.

In this instance, the thickness of the second film 26 may be equal to or less than the thickness of the first film 24. Since the second film 26 has a refractive index which is equal to or greater than that of the first film 24, the thickness of the second film 26 is equal to or less than the thickness of the first film 24 in consideration of reflection characteristics. Further, if the thickness of the second film 26 having a great extinction coefficient is increased, a large amount of light is absorbed and loss of light incident upon the solar cell 100 may occur. Further, the thickness of the third film 22 may be less than the thicknesses of the first film 24 and the second film 26. The reason for this is that it is difficult to form the third film 22 having a large thickness by thermal oxidation. For example, the thickness of the third film 22 may be 5 nm or less (for example, 0.1 nm to 3 nm). Such a thickness of the third film 22 is restricted to a thickness value which may be formed by thermal oxidation, but the disclosure is not limited thereto. That is, the third film 22 may have a different thickness through other methods than thermal oxidation or by changing process conditions.

The refractive index of the first film 24 (for example, the refractive index of the first film 24 with respect to light having a wavelength of 633 nm) formed of a silicon nitride film, as described above, may be 1.95 to 2.05. If the refractive index of the first film 24 is less than 1.95, the density of the first film 24 is insufficient and thus passivation characteristics may be lowered. If the refractive index of the first film 24 exceeds 2.05, the extinction coefficient of the first film 24 is increased and thus passivation characteristics may be lowered. Further, the thickness of the first film 24 may be 50 nm to 90 nm. If the thickness of the first film 24 is less than 50 nm, passivation due to field effects may be insufficient. If the thickness of the first film 24 exceeds 90 nm, a process time and costs may be increased and reflectivity reduction effects implemented by the refractive indexes and thicknesses of the first film 24 and the second film 26 may be insufficient.

If the second film 26 is a silicon carbonitride film, the second film 26 has a chemical formula of $SiC_xN_{1-x}$ and x may be 0.3 to 0.9. If the amount of carbon in the silicon carbonitride film is increased, the refractive index of the second film 26 may be decreased and the extinction coefficient of the second film 26 may be increased. If x is less than 0.3, the amount of carbon is insufficient and thus effects, such as improvement in chemical stability, may be insufficient, and it may be difficult for the second film 26 to have a refractive index, which is equal to or less than that of the first film 24, and an extinction coefficient, which is equal to or greater than that of the first film 24. If x exceeds 0.9, the amount of nitrogen is insufficient and thus the second film 26 may be easily oxidized at a high temperature.

In this instance, the refractive index of the second film 26 may be 1.8 to 1.98, and the thickness of the second film 26 may be 5 nm to 30 nm. Such a refractive index is restricted to a range which may be implemented by the second film 26 formed as a silicon carbonitride film, and the refractive index and thickness of the second film 26 are restricted to ranges which may maximize reflectivity reduction effects in consideration of the refractive index and thickness of the first film 24. If the thickness of the second film 26 is less than 5 nm, effects, such as improvement in chemical stability by the second film 26, are insufficient. If the thickness of the second film 26 exceeds 30 nm, a process time and costs may be increased and reflectivity reduction effects implemented by the refractive indexes and thicknesses of the first film 24 and the second film 26 may be insufficient. In this instance, the thickness of the second film 26 may be less than the thickness of the first film 24, considering that the refractive index of the second film 26 is high so as to be similar to the refractive index of the first film 24.

If the second film 26 is a silicon oxycarbide film, the second film 26 has a chemical formula of $SiO_{1-y}C_y$, and y may be 0.5 to 0.9. If the amount of carbon in the silicon oxycarbide film is increased, the refractive index and extinction coefficient of the second film 26 may be increased. If y is less than 0.5, the amount of carbon is insufficient and thus effects, such as improvement in chemical stability, may be insufficient, and the refractive index of the second film 26 may be insufficient or it may be difficult for the second film 26 to have an extinction coefficient, which is equal to or greater than that of the first film 24. If y exceeds 0.9, the amount of oxygen is insufficient and thus the second film 26 may be easily oxidized at a high temperature.

In this instance, the refractive index of the second film 26 may be 1.4 to 1.6, and the thickness of the second film 26 may be 25 nm to 90 nm. Such a refractive index is restricted to a range which may be implemented by the second film 26 formed as a silicon oxycarbide film, and the refractive index and thickness of the second film 26 are restricted to ranges which may maximize reflectivity reduction effects in consideration of the refractive index and thickness of the first film 24. If the thickness of the second film 26 is less than 25 nm, effects, such as improvement in chemical stability by the second film 26, are insufficient. If the thickness of the second film 26 exceeds 90 nm, a process time and costs may be increased and reflectivity reduction effects implemented by the refractive indexes and thicknesses of the first film 24 and the second film 26 may be insufficient. In this instance, the thickness of the second film 26 may be equal to or less than the thickness of the first film 24, considering that the refractive index of the second film 26 is much lower than the refractive index of the first film 24. Alternatively, the thickness of the second film 26 may be greater than the thickness of the first film 24, considering the refractive indexes of the first and second films 24 and 26.

As such, the first film 24 together with the third film 22 may function as a passivation film to improve passivation effects and the first film 24 together with the second film 26 may function as an anti-reflection film to reduce reflectivity. The first film 24 and the second film 26 may be formed through various methods. For example, the first film 24 and the second film 26 may be formed through chemical vapor deposition (particularly, plasma enhanced chemical vapor deposition (PECVD)). Thereby, the first film 24 and the second film 26 having desired compositions and characteristics may be formed. Particularly, passivation characteristics of the first film 24 may be greatly varied according to the composition and characteristics of the first film 24, and it may be difficult for the first film 24 and the second film 26 to have desired compositions, characteristics, etc. through sputtering. In this instance, the first film 24 and the second film 26 may be formed by an in-situ process in which process gas is changed using the same deposition equipment. For example, if the first film 24 is a silicon nitride film and the second film 25 is a silicon carbonitride film, the second film 26 may be formed by additionally supplying gas including carbon (for example, methane gas) in the process conditions for forming the first film 24. However, the disclosure is not limited thereto, and the first film 24 and the second film 26 may be formed using different apparatuses or in different chambers.

The figures by example illustrate the semiconductor substrate 10, the third film 22, the first film 24 and the second film 26 as being formed in contact with each other. Thereby, the structure of the solar cell 100 may be simplified and the manufacturing costs of the solar cell 100 may be reduced. However, the disclosure is not limited thereto.

The rear passivation film 40 formed on the semiconductor layer 30 contacts the semiconductor substrate 10 and thus immobilizes defects present on the front surface of the semiconductor substrate 10 or the semiconductor layer 30 or in the bulk of the semiconductor substrate 10 or the semiconductor layer 30. Thereby, open-circuit voltage of the solar cell 100 may be increased by removing recombination sites of minority carriers. In this instance, the rear passivation film 40 is provided with contact holes 402 and 404 for conductive connection between the conductivity-type regions 32 and 34 and the electrodes 42 and 44. The contact holes 402 and 404 include first contact holes 402 for connection between the first conductivity-type regions 32 and the first electrodes 42 and second contact holes 404 for connection between the second conductivity-type regions 34 and the second electrodes 44. Therefore, the rear passivation film 40 serves to prevent the first conductivity-type regions 32 and the second conductivity-type regions 34 from being connected to the electrodes to which the corresponding conductivity-type regions 32 and 34 should not be connected (i.e., in the instance of the first conductivity-type regions 32, the second electrodes 44 and, in the instance of the second conductivity-type regions 34, the first electrodes 42). Further, the rear passivation film 40 may have effects of passivating the first and second conductivity-type regions 32 and 34 and/or the barrier regions 36.

The rear passivation film 40 may be formed of various materials. For example, the rear passivation film 40 may have a single layer structure including one selected from the group consisting of a silicon nitride film, a silicon nitride film including hydrogen, a silicon oxide film, a silicon oxynitride film, an aluminum oxide film, a silicon carbide film, a $MgF_2$ film, a ZnS film, a $TiO_2$ film and a $CeO_2$ film, or a multilayer structure including a combination of two or more thereof. For example, the rear passivation film 40 may be a silicon oxide film, a silicon nitride film and/or a silicon carbide film.

In this embodiment, the insulating films 21 may be substantially formed on the entirety of the front surface of the semiconductor substrate 10. Further, the rear passivation film 40 may be formed on the entirety of the rear surface of the semiconductor layer 30 except for the contact holes 402 and 404. In this instance, formation on the entirety of a surface not only includes physically covering the entirety of the surface but also includes inevitably excluding some regions. For example, in this embodiment, the front passivation film 24 and/or the anti-reflection film 26 and the rear passivation film 40 may not include the above-described dopants so as to have excellent insulating characteristic, passivation characteristics, etc.

The first electrode 42 is formed by filling at least a part of the first contact hole 402 of the passivation film 40 and conductively connected to (for example, contacts) the first conductivity-type region 32, and the second electrode 44 is formed by filling at least a part of the second contact hole 404 of the passivation film 40 and conductively connected to (for example, contacts) the second conductivity-type region 34. In this instance, the first electrodes 42 or the second electrodes 44 may be formed as metal electrodes formed in a designated pattern and contact the first or second conductivity-type regions 32 or 34. However, the disclosure is not limited thereto.

Hereinafter, with reference to FIGS. 1 and 2, the plan shapes of the first conductivity-type regions 32, the second conductivity-type regions 34, the barrier regions 36, and the first and second electrodes 42 and 44 will be by example described in detail.

With reference to FIGS. 1 and 2, in this embodiment, the first conductivity-type regions 32 and the second conductivity-type regions 34 are respectively extended and provided in a stripe pattern. In this instance, the first conductivity-type regions 32 and the second conductivity-type regions 34 are alternately located in a direction intersecting the lengthwise direction. The barrier region 36 to separate the first conductivity-type region 32 and the second conductivity-type region 34 may be located between the first conductivity-type region 32 and the second conductivity-type region 34. Designated side edges of the first conductivity-type regions 32, which are separated from each other, may be connected, and the other side edges of the second conductivity-type regions 34, which are separated from each other, may be connected. However, the disclosure is not limited thereto.

In this instance, the area of the first conductivity-type region 32 may be greater than the area of the second conductivity-type region 34. For example, the areas of the first conductivity-type region 32 and the second conductivity-type region 34 may be adjusted by varying the widths thereof. That is, the width W1 of the first conductivity-type region 32 may be greater than the width W2 of the second conductivity-type region 34. Further, the first electrodes 42 may be formed in a stripe pattern corresponding to the first conductivity-type regions 32, and the second electrodes 44 may be formed in a stripe pattern corresponding to the second conductivity-type regions 34. The contact holes 402 and 404 (with reference to FIG. 1) may be formed to connect only a part of each of the first and second electrodes 42 and 44 to the corresponding one of the first conductivity-type regions 32 and the second conductivity-type regions 34. For example, a plurality of contact holes 402 and 404 may be provided. Alternately, the contact holes 402 and 404 may be formed to correspond to the overall length of the first and second electrodes 42 and 44. Thereby, the contact areas between the first and second electrodes 42 and 44 and the first and second conductivity-type regions 32 and 34 are maximized and thus carrier collection efficiency may be improved. In addition, various modifications are possible.

Designated side edges of the first electrodes 42 may be connected, and the other side edges of the second electrodes 44 may be connected. However, the disclosure is not limited thereto.

When light is incident upon the solar cell 100 in accordance with this embodiment, electrons and holes are generated by photoelectric conversion at a p-n junction formed between the base region 110 and the first conductivity-type regions 32, and the generated electrons and holes pass through the control passivation layer 20 by tunneling, move to the first conductivity-type regions 32 and the second conductivity-type regions 34 and then move to the first and second electrodes 42 and 44. Thereby, electric energy is generated.

In the solar cell 100 in accordance with this embodiment having a rear surface electrode structure in which the electrodes 42 and 44 are formed on the rear surface of the semiconductor substrate 10 and no electrodes are formed on the front surface of the semiconductor substrate 10, shading loss on the front surface of the semiconductor substrate 10 may be minimized. Thereby, efficiency of the solar cell 100 may be improved. However, the disclosure is not limited thereto.

Further, since the first and second conductivity-type regions 32 and 34 are formed on the semiconductor substrate 10 with the control passivation layer 20 interposed therebetween, the first and second conductivity-type regions 32 and 34 are formed as a separate layer differing from the semiconductor substrate 10. Therefore, loss due to recombination may be minimized, as compared to the instance that doping regions formed by doping the semiconductor substrate 10 with dopants are used as conductivity-type regions.

In this embodiment, among the insulating films 21, the second film 26 located at the more exterior position than that of the first film 24 has a higher carbon content than the first film 24 and may thus improve chemical stability. The extinction coefficient of the second film 26 (particularly, the extinction coefficient of the second film 26 with respect to light having a short wavelength) is equal to or greater than the extinction coefficient of the first film 24, thus preventing characteristic change of the solar cell 100 by light or damage to the solar cell 100 due to light. In this instance, the second film 26 has a lower refractive index than the first film 24 and may thus reduce reflectivity.

The above-described embodiment by example describes the first and second conductivity-type regions 32 and 34 as being located on the rear surface of the semiconductor substrate 10 and the insulating films 21 as being located on the entirety of the front surface of the semiconductor substrate 10. Thereby, reflection of light by the front surface of the semiconductor substrate 10, upon which a relatively large amount of light is incident, may be reduced. Further, since the second film 26 of the insulting films 21 includes carbon and may not be proper to fire-through, the insulating films 21 are formed on the surface of the semiconductor substrate 10, which is not provided with the electrodes 42 and 44, and thus the electrodes 42 and 44 may be formed by various easy processes. However, the disclosure is not limited thereto, and the insulating films 21 may be located on at least one of the front and rear surfaces of the solar cell 100 having various structures. For example, the above-described insulating films 21 may be applied to the rear passivation film 40 located on the first and second conductivity-type regions 32 and 34 and provided with the contact holes 402 and 404 for connection with the first and second electrodes 42 and 44. In this instance, the rear passivation film 40 may include the first film 24, the second film 26 and the third film 22. In addition, various modifications are possible. Now, with reference to FIG. 3, another embodiment of the present invention will be described in detail.

Figure 3:
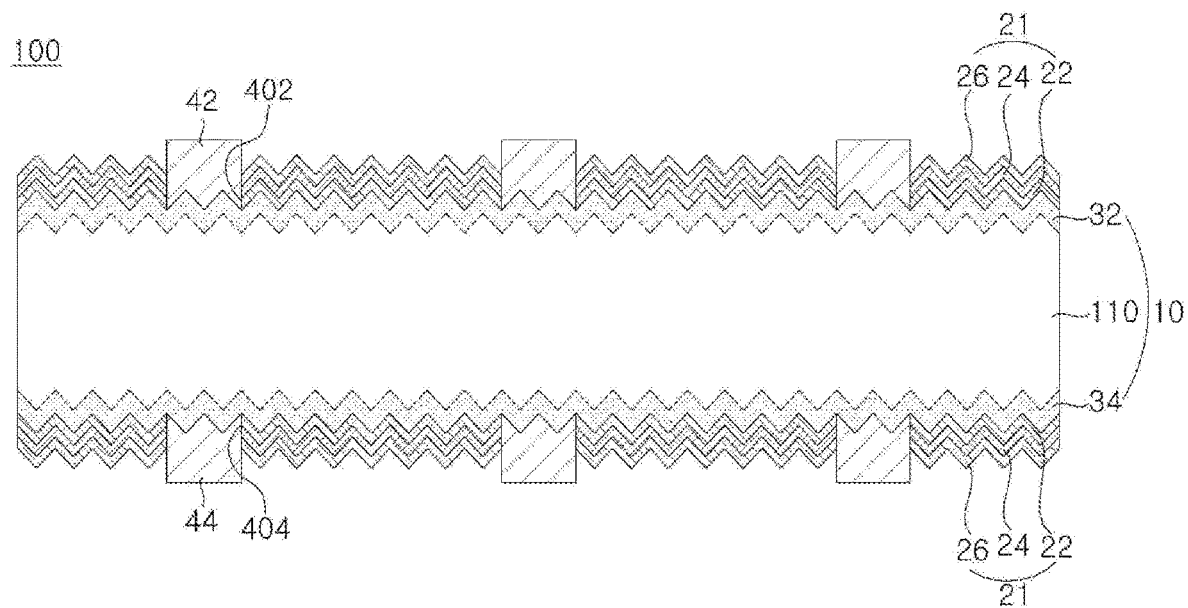
FIG. 3 is a cross-sectional view of a solar cell in accordance with another embodiment of the present invention.

FIG. 3 is a cross-sectional view of a solar cell in accordance with another embodiment of the present invention. Hereinafter, a detailed description of parts of the construction and operation of this embodiment which are substantially the same as those of the former embodiment shown in FIGS. 1 and 2 are omitted and only parts of the construction and operation of this embodiment which differ from the description of the former embodiment will be described in detail. Embodiments, in which the former embodiment and modified embodiments thereof and the latter embodiment and modified embodiments thereof are combined, will be within the scope and spirit of the invention as disclosed in the accompanying claims.

With reference to FIG. 3, in this embodiment, a first conductivity-type region 32 and a second conductivity-type region 34 are formed as doping regions formed by doping a semiconductor substrate 10 with first and second conductivity-type dopants. A base region 110 may be the first or second conductivity-type, and include the first or second conductivity-type dopant at a lower concentration than the first or the second conductivity-type region 32 or 34. The first conductivity-type region 32 is located on the front surface of the semiconductor substrate 10 and the second conductivity-type region 34 is located on the rear surface of the semiconductor substrate 10. However, the disclosure is not limited thereto, and at least one of the first and second conductivity-type regions 32 and 34 may be formed as a layer differing from the semiconductor substrate 10 or formed as a semiconductor layer having a crystalline structure differing from the semiconductor substrate 10. In this instance, a control passivation layer 20 (with reference to FIG. 1) may be formed between the semiconductor substrate 10 and at least one of the first and second conductivity-type regions 32 and 34, or may not be formed therebetween.

Insulating films 21 may be located on the front surface of the semiconductor substrate 10 or on the first conductivity-type region 32, and insulating films 21 may be located on the rear surface of the semiconductor substrate 10 or on the second conductivity-type region 34.

As such, in this embodiment, first and second electrodes 42 and 44 of the solar cell 100 are formed in a designated pattern and, thus, the solar cell 10 has a bi-facial light-receiving structure in which light may be incident upon the front and rear surfaces of the semiconductor substrate 110. Thereby, a quantity of light used by the solar cell 100 is increased, thus contributing to improvement in efficiency of the solar cell 100. In this instance, the second films 26 may improve chemical stability of the front and rear surfaces of the semiconductor substrate 10 and stability against light having a short wavelength and reduce reflectivity. However, the disclosure is not limited thereto, and the second electrodes 44 may be formed on the entire rear surface of the semiconductor substrate 110.

Although FIG. 3 by example illustrates the insulating films 21 located on each of the front and rear surfaces of the semiconductor substrate 10 as including the first film 24, the second film 26 and the third film 22, the disclosure is not limited thereto. The insulating films 21 located on one of the front and rear surfaces of the semiconductor substrate 10 include the first film 24, the second film 26 and the third film 22, as described above.

Hereinafter, the present invention will be described in more detail with reference to Experimental Examples of the present invention. Experimental Examples of the present invention which will be described below are purely by example and the disclosure is not limited thereto.

Experimental Example 1

A control passivation layer formed of a silicon oxide film is formed on one surface of an n-type monocrystalline semiconductor substrate. A semiconductor layer including polycrystalline silicon is formed on the control passivation layer by low pressure chemical vapor deposition. First conductivity-type regions are formed by doping some regions of the semiconductor layer with a p-type dopant and second conductivity-type regions are formed by doping other regions of the semiconductor layer with an n-type dopant. Further, a rear passivation film formed as a silicon nitride film is formed on the rear surface of the semiconductor substrate, and a silicon nitride film and a silicon carbonitride film are formed on the front surface of the semiconductor substrate by plasma induced chemical vapor deposition. In this instance, the silicon carbonitride film is formed under the same process conditions as the silicon nitride film by additionally supplying gas including carbon (methane gas). A silicon oxide film is formed between the front surface of the semiconductor substrate and the silicon nitride film by thermal oxidation and, thus, insulating films including the silicon oxide film, the silicon nitride film and the silicon carbonitride film are formed on the front surface of the semiconductor substrate. First electrodes and second electrodes are conductively connected to the first conductivity-type regions and the second conductivity-type regions are formed on the rear passivation film through contact holes.

Experimental Example 2

A solar cell is manufactured through the same method as in above Experimental Example 1 except that insulating films formed on the front surface of a semiconductor substrate include a silicon oxide film, a silicon nitride film and a silicon oxycarbide film, which are sequentially stacked.

Comparative Example

A solar cell is manufactured through the same method as in above Experimental Example 1 or Experimental Example 2 except that insulating films formed on the front surface of a semiconductor substrate include a silicon oxide film and a silicon nitride film, which are sequentially stacked, without a silicon carbonitride film or a silicon oxycarbide film.

Figure 4:
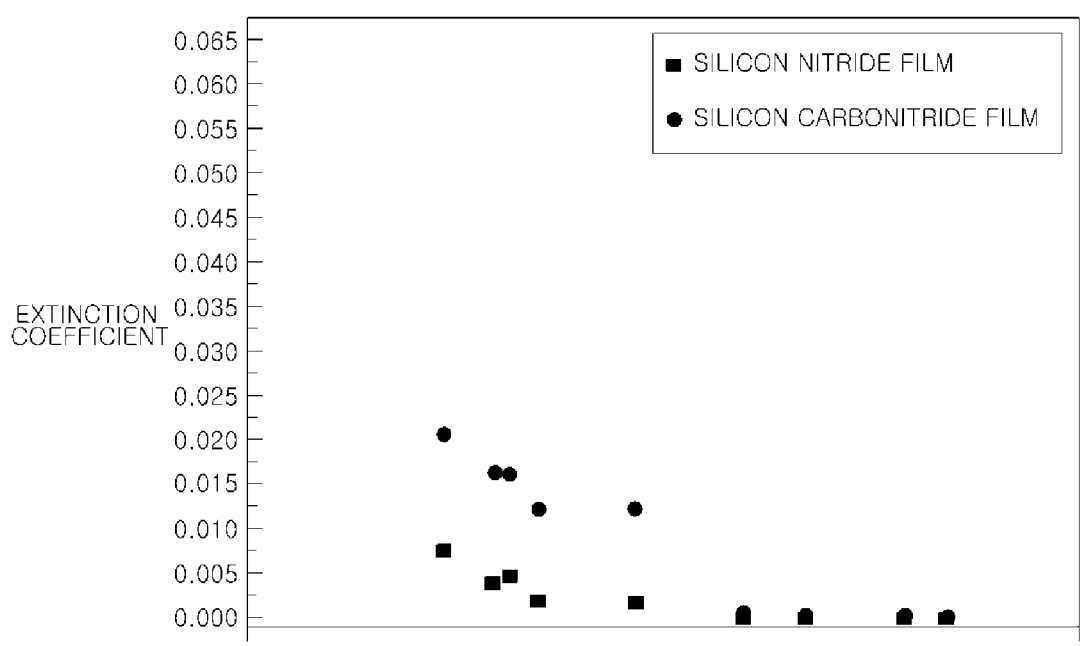
FIG. 4 is a graph illustrating results of measurement of extinction coefficients of silicon nitride films and silicon carbonitride films of solar cells, manufactured by Experimental Example 1, with respect to light having a wavelength of 400 nm.
Figure 5:
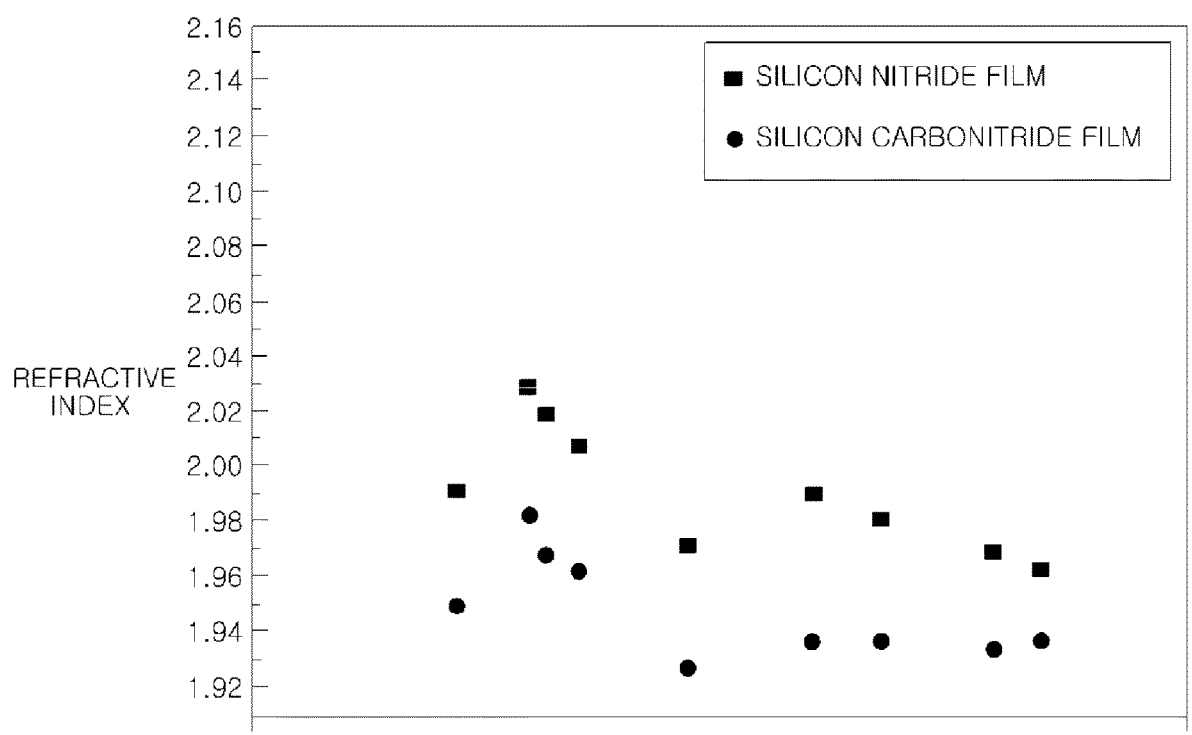
FIG. 5 is a graph illustrating results of measurement of refractive indexes of the silicon nitride films and the silicon carbonitride films of the solar cells, manufactured by Experimental Example 1, with respect to light having a wavelength of 633 nm.

A plurality of solar cells are manufactured by Experimental Example 1, and FIGS. 4 and 5 are graphs respectively illustrating results of measurement of extinction coefficients of silicon nitride films and silicon carbonitride films of the respective solar cells with respect to light having a wavelength of 400 nm and results of measurement of refractive indexes of the silicon nitride films and the silicon carbonitride films of the solar cells with respect to light having a wavelength of 633 nm. With reference to FIG. 4, it may be understood that the extinction coefficients of the silicon carbonitride films are equal to or greater than the extinction coefficients of the silicon nitride films. Further, with reference to FIG. 5, it may be understood that the refractive indexes of the silicon carbonitride films are less than the refractive indexes of the silicon nitride films. Thereby, it may be understood that the silicon carbonitride films have extinction coefficients, which are equal to or greater than those of the silicon nitride films, and refractive indexes, which are less than those of the silicon nitride films. In this instance, it may be understood that the silicon nitride films and the silicon carbonitride films have extinction coefficients of 0.25 or less with respect to light having a wavelength of 400 nm, and the silicon nitride films have extinction coefficients of 0.20 or less with respect to light having the wavelength of 400 nm.

Figure 6:
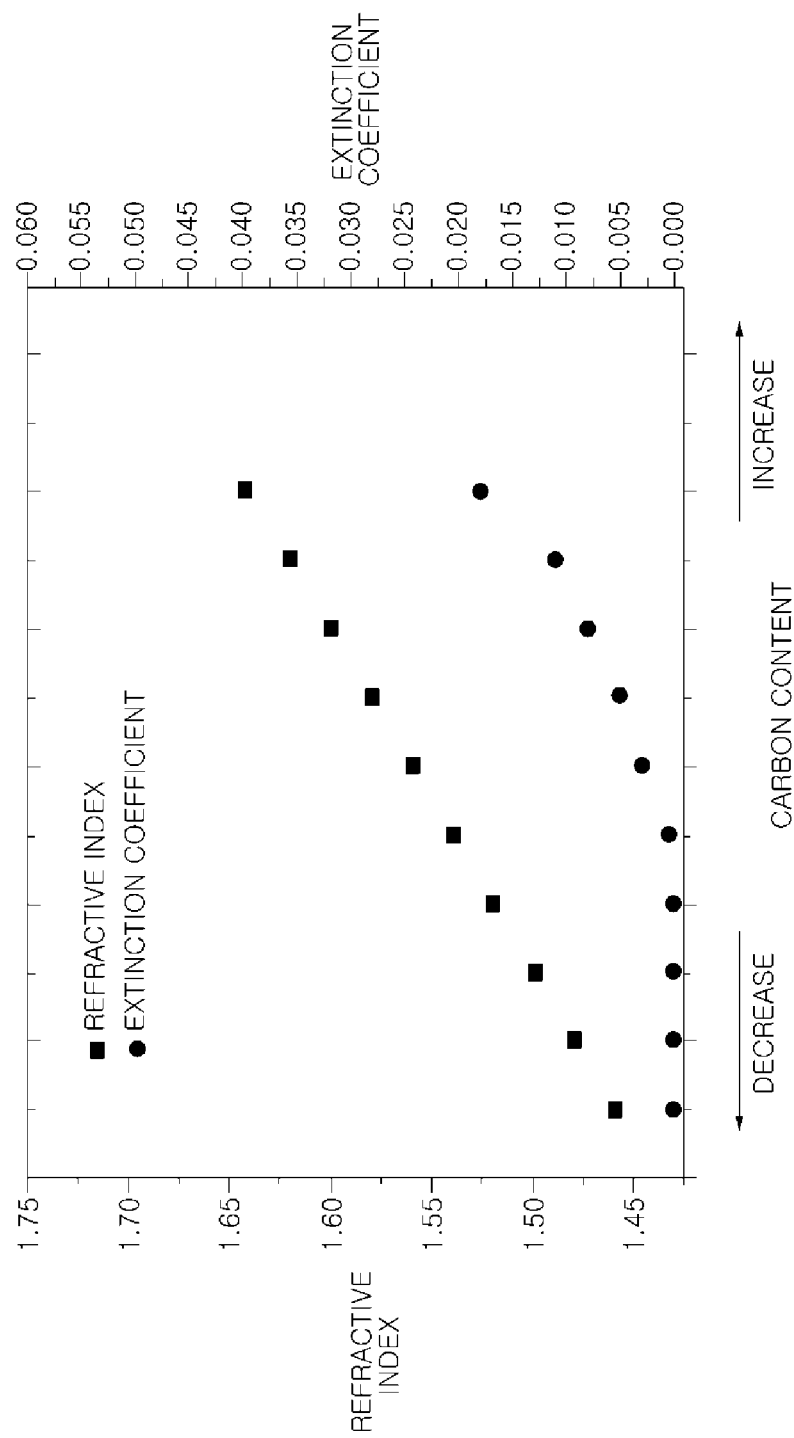
FIG. 6 is a graph illustrating results of measurement of refractive indexes (with respect to light having a wavelength of 633 nm) and extinction coefficients (with respect to light having a wavelength of 400 nm) of silicon oxycarbide films of solar cells, manufactured by Experimental Example 2, according to carbon content.

A plurality of solar cells are manufactured by Experimental Example 2, and FIG. 6 is a graph illustrating results of measurement of refractive indexes (refractive indexes with respect to light having a wavelength of 633 nm) and extinction coefficients (extinction coefficients with respect to light having a wavelength of 400 nm) of silicon oxycarbide films of the solar cells according to carbon content. With reference to FIG. 6, it may be understood that the refractive indexes and extinction coefficients of the silicon oxycarbide films are increased as carbon contents in the silicon oxycarbide films increase. In this instance, it may be understood that the silicon oxycarbide films have extinction coefficients of 0.25 or less with respect to light having a wavelength of 400 nm.

Figure 7:
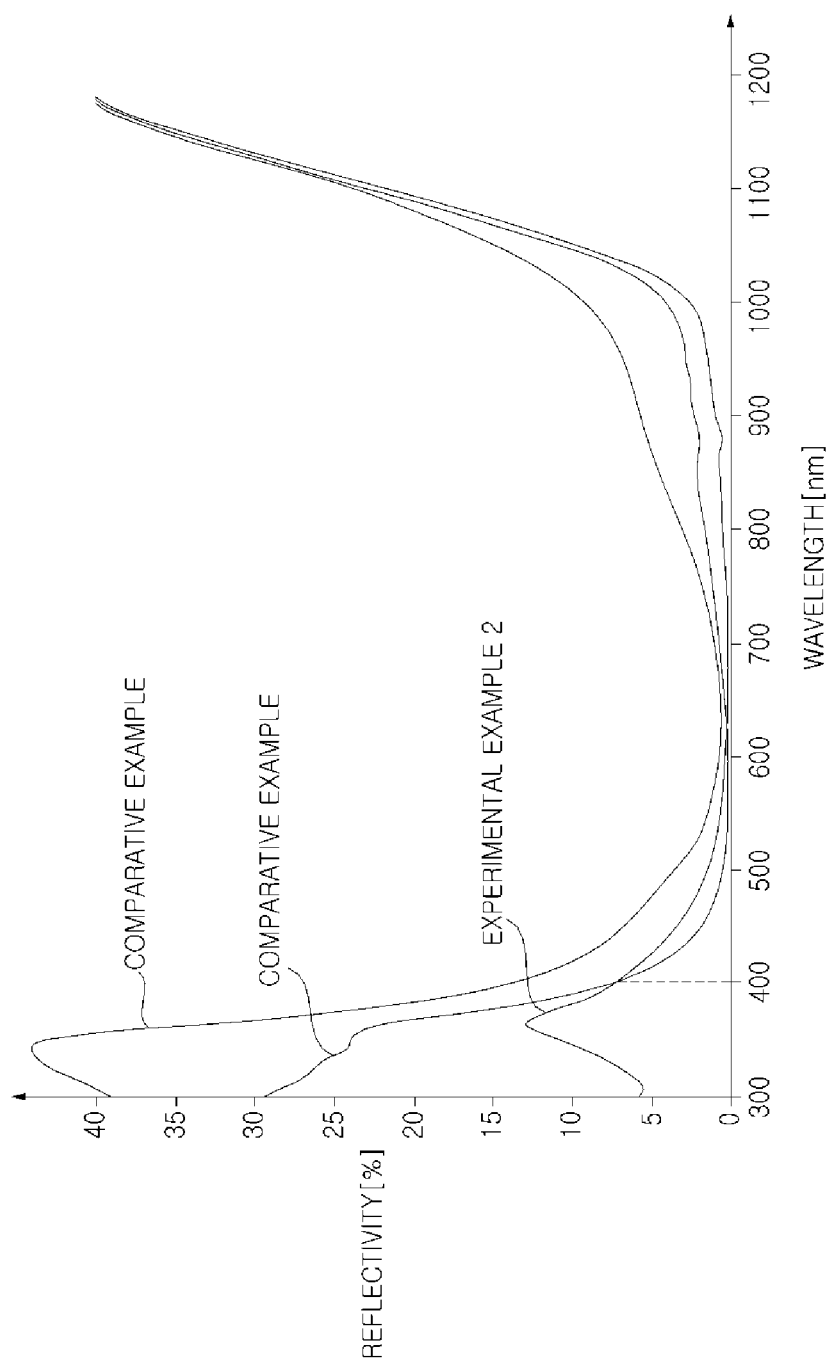
FIG. 7 is a graph illustrating results of measurement of reflectivities of solar cells manufactured by Experimental Example 1, Experimental Example 2 and Comparative Example.

Further, FIG. 7 is a graph illustrating results of measurement of reflectivities of one of the solar cells manufactured by Experimental Example 1, one of the solar cells manufactured by Experimental Example 2 and a solar cell manufactured by Comparative Example. It may be understood that the solar cell of Experimental Example 1 and the solar cell of Experimental Example 2 have lower reflectivities than that of the solar cell of Comparative Example with respect to light having a short wavelength (i.e., light having a wavelength of 400 nm or shorter). Thereby, it may be understood that the solar cells of Experimental Examples 1 and 2 effectively absorb light having the short wavelength due to formation of the silicon carbonitride film or the silicon oxycarbide film. Particularly, it may be understood that the reflectivity of the solar cell of Experimental Example 2 using the silicon oxycarbide film with respect to light having a short wavelength is much lower than the reflectivity of the solar cell of Experimental Example 1 with respect to light having the short wavelength. Therefore, stability of the solar cell of Experimental Example 2 against light having the short wavelength is more excellent than that of the solar cell of Experimental Example 1.

As apparent from the above description, in a solar cell in accordance with one embodiment of the present invention, a second film located at a more exterior position than that of a first film has a higher carbon content than that the first film and may thus improve chemical stability of insulating films. Further, the second film has an extinction coefficient (particularly, an extinction coefficient with respect to light having a short wavelength), which is equal to or greater than the extinction coefficient of the first film, and may thus prevent change of characteristics of the solar cell or damage to the solar cell due to light. In this instance, the second film has a lower refractive index than the refractive index of the first film, and may thus reduce reflectivity.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell comprising:
   a semiconductor substrate;
   electrodes formed on a rear surface of the semiconductor substrate;
   a silicon oxide layer located on a front surface of the semiconductor substrate;
   a silicon nitride layer directly located on the silicon oxide layer at the front surface of the semiconductor substrate, and having a first refractive index greater than a refractive index of the silicon oxide layer and a first extinction coefficient greater than an extinction coefficient of the silicon oxide layer, the silicon nitride layer not including carbon; and
   a silicon oxycarbide layer directly located on the silicon nitride layer at the front surface of the semiconductor substrate to form an outermost layer among the silicon oxide layer, the silicon nitride layer, and the silicon oxycarbide layer, and having a second refractive index less than the first refractive index and a second extinction coefficient greater than the first extinction coefficient,
   wherein the second extinction coefficient of the silicon oxycarbide layer with respect to light having the wavelength of 400 nm or shorter is greater than the first extinction coefficient of the silicon nitride layer with respect to light having the wavelength of 400 nm or shorter by a value greater than 0.01,
   wherein a thickness of the silicon oxycarbide layer is less than a thickness of the silicon nitride layer,
   wherein a thickness of the silicon oxide layer is less than each of the thickness of the silicon nitride layer and the thickness of the silicon oxycarbide layer,
   wherein electrodes penetrating the silicon oxide layer, the silicon nitride layer, and the silicon oxycarbide layer are not formed thereon and the electrodes are not formed at the front surface of the semiconductor substrate, so the silicon oxide layer, the silicon nitride layer, and the silicon oxycarbide layer are formed entirely,
   wherein the silicon oxycarbide layer has a chemical formula of $SiO_{1-y}C_y$ and y is 0.5 to 0.9, and 0.9,
   wherein among the silicon oxide layer, the silicon nitride layer, and the silicon oxycarbide layer, the silicon oxycarbide layer having a largest extinction coefficient is located on the outermost layer, and a surface thereof in contact with the semiconductor substrate is formed so as not to contain carbon to retain a passivation effect, and
   wherein the second extinction coefficient of the silicon oxycarbide layer with respect to light having the wavelength of 400 nm or shorter is 0.02~0.015 and the silicon oxycarbide layer has a thickness of 25 nm to 90 nm.

2. The solar cell according to claim 1, wherein:
   the silicon nitride layer has the first refractive index of 1.95 to 2.05 and a thickness of 50 nm to 90 nm; and
   the silicon oxycarbide layer has the second refractive index of 1.4 to 1.6.

3. The solar cell according to claim 1, further comprising a control passivation layer located between the rear surface of the semiconductor substrate and first and second conductivity-type regions at the rear surface of the semiconductor substrate,
   wherein a barrier region is located between the first conductivity-type region and the second conductivity-type region on the control passivation layer.

4. The solar cell according to claim 1, wherein a carbon content in stacked layers of silicon oxycarbide layer, the silicon nitride layer, and the silicon oxide layer is decreased in an incidence light direction of the solar cell.

5. The solar cell according to claim 1, wherein the silicon oxide layer is located directly on the front surface of the semiconductor substrate.

6. The solar cell according to claim 1, wherein the silicon nitride layer is an intervening layer between the silicon oxycarbide layer and the silicon oxide layer.

7. The solar cell according to claim 1, wherein an amount of carbon in the silicon oxide layer and the silicon nitride layer is the same.

* * * * *